(12) United States Patent
Wu

(10) Patent No.: US 9,202,921 B2
(45) Date of Patent: Dec. 1, 2015

(54) SEMICONDUCTOR DEVICE AND METHOD OF MAKING THE SAME

(75) Inventor: Tieh-Chiang Wu, I-Lan Hsien (TW)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 581 days.

(21) Appl. No.: 12/749,532

(22) Filed: Mar. 30, 2010

(65) Prior Publication Data

US 2011/0241093 A1  Oct. 6, 2011

(51) Int. Cl.
| H01L 27/12 | (2006.01) |
| H01L 29/78 | (2006.01) |
| H01L 27/108 | (2006.01) |
| H01L 29/66 | (2006.01) |

(52) U.S. Cl.
CPC ...... *H01L 29/7851* (2013.01); *H01L 27/10826* (2013.01); *H01L 27/10879* (2013.01); *H01L 27/10894* (2013.01); *H01L 29/66795* (2013.01)

(58) Field of Classification Search
USPC ........................................................ 257/351
See application file for complete search history.

(56) References Cited

U.S. PATENT DOCUMENTS

| 7,034,408 B1 | 4/2006 | Schloesser |
| 7,279,742 B2 | 10/2007 | Gruning-Von Schwerin |
| 7,416,943 B2 | 8/2008 | Figura |
| 2006/0027869 A1* | 2/2006 | Kim .................. H01L 29/78696 257/351 |
| 2008/0119020 A1 | 5/2008 | Grisham |
| 2009/0111265 A1* | 4/2009 | Min .................. H01L 21/31144 438/682 |
| 2009/0114989 A1* | 5/2009 | Hamamoto ............. H01L 21/84 257/347 |
| 2009/0206443 A1 | 8/2009 | Juengling |
| 2009/0238000 A1 | 9/2009 | Juengling |
| 2009/0251946 A1 | 10/2009 | Juengling |

FOREIGN PATENT DOCUMENTS

| CN | 1577888 A | 2/2005 |
| EP | 2 372 772 A2 | 10/2011 |
| JP | 2001210729 A | 8/2001 |
| JP | 2008511997 A | 4/2008 |
| JP | 2009531860 A | 9/2009 |
| TW | 200505020 | 2/2005 |
| TW | 200947567 | 11/2009 |
| WO | 2006028777 A1 | 3/2006 |
| WO | 2007123609 A1 | 11/2007 |

* cited by examiner

*Primary Examiner* — Vongsavanh Sengdara
(74) *Attorney, Agent, or Firm* — Winston Hsu; Scott Margo

(57) ABSTRACT

A dual channel transistor includes a semiconductor island isolated by a first shallow trench isolation (STI) extending along a first direction and a second STI extending along a second direction, wherein the first direction intersect the second direction. The dual channel transistor further includes a gate trench recessed into the semiconductor island and extending along the second direction. A gate is located in the gate trench. A first U-shaped channel region is formed in the semiconductor island. A second U-shaped channel region is formed in the semiconductor island, wherein the second U-shaped channel region is segregate from the first U-shaped channel region by the gate. During operation, the gate controls two U-shaped channel regions simultaneously.

23 Claims, 22 Drawing Sheets

SEMICONDUCTOR DEVICE AND METHOD OF MAKING THE SAME

BACKGROUND OF THE INVENTION

1. Field of the Invention

The present invention relates generally to a semiconductor device. More specifically, the present invention relates to a dual-channel transistor for ultra-high density semiconductor devices including a dynamic random access memory (DRAM) and a fabrication method thereof.

2. Description of the Prior Art

As known in the art, DRAM is a combination of a large number of DRAM cells. A metal oxide semiconductor (MOS) transistor and a capacitor connected in series constitute a DRAM cell. The MOS transistor is a switch device for controlling the data input or output from the capacitor.

The design of the capacitor of the DRAM cell involves two conductive layers and an insulating layer. The two conductive layers act as the upper and lower electrodes, respectively, and the insulating layer separates the two electrodes. When a predetermined voltage is applied between the two electrodes, charges are stored in the insulating layer disposed between the two electrodes. With advance of semiconductor processing technology, the volume and the unit size of the DRAM cell continue to shrink in an aggressive manner.

With the continuing shrinkage of device feature size, it becomes increasingly difficult to overcome the short channel effect (SCE) as the gate channel length of a memory cell transistor becomes shortened. The SCE due to shrunk gate channel length can hinder further integration of the IC chips. Many efforts have been made for solving this problem, for example, by reducing the thickness of the gate dielectric layer or by increasing the doping concentration of the source/drain region. However, these approaches are impracticable because they tend to adversely affect the device reliability and degrade speed of data transfer.

Another problem includes an increased junction leakage current. As the junction leakage current increases, the data retention time is reduced and the refresh characteristic of the memory device is deteriorated. The contact area of a contact plug that contacts with a source/drain region is also reduced. Thus, the electrical resistance of the contact plug is increased and this becomes an obstacle to the stable and steady operation of the memory device.

It is also highly desirable to put as many memory cells as possible in a single wafer. To maximize the memory cell packing density, the cell area of each unit memory cell has to be minimized.

SUMMARY OF THE INVENTION

It is one object of this invention to provide a transistor structure suited for semiconductor memory devices including DRAMs and a method of fabricating the same in order to solve the above-mentioned prior art problems. The summary is not intended to limit the scope of the invention, which is defined solely by the claims.

According to one aspect of the present invention, a semiconductor device includes a semiconductor island isolated by a first shallow trench isolation (STI) extending along a first direction and a second STI extending along a second direction, wherein the first direction perpendicular to the second direction, a gate trench recessed into the semiconductor island and extending along the second direction. The semiconductor device further includes a gate located in the gate trench, a first U-shaped channel region in the semiconductor island and a second U-shaped channel region in the semiconductor island, wherein the second U-shaped channel region is separated from the first U-shaped channel region by the gate.

According to another aspect of the present invention, a semiconductor device includes a semiconductor island isolated by a first STI extending along a first direction and a second STI extending along a second direction, wherein the first direction perpendicular to the second direction, a gate trench extending along a second direction and recessed into the substrate, a gate extending along the second direction and embedded in the gate trench. The semiconductor device further includes a first dielectric layer encapsulating the gate in the gate trench, a first source/drain regions disposed along the second direction and disposed with respect to a surface of the semiconductor island, a second dielectric layer embedded in the semiconductor island and disposed between the first source/drain regions, a first U-shaped channel region disposed around the second dielectric layer and between the first source/drain regions, a second source/drain regions disposed along the second direction and disposed with respect to a surface of the semiconductor island, a third dielectric layer embedded in the semiconductor island and between the second source/drain regions and a second U-shaped channel region disposed around the third dielectric layer and between the second source/drain regions.

According to another aspect of the present invention, a method of fabricating a semiconductor device includes providing a semiconductor island isolated by a first STI extending along a first direction and a second STI extending along a second direction, and a first dielectric layer embedded in the semiconductor island along the first direction, wherein the first direction perpendicular to the second direction. Then, a gate trench is formed in the semiconductor island along the second direction, wherein the gate trench crosses the first dielectric layer. Later, a second dielectric layer is formed on a side wall of the gate trench. Subsequently, a gate is formed along the second direction in the gate trench. Next, a third dielectric layer is formed on the gate. Finally, a first source/drain regions and a second source/drain regions is formed on the side wall of the gate trench, wherein the first source/drain regions and the second source/drain regions are at opposite sides of the gate, and the first dielectric layer is disposed between the first source/drain regions, and the second source/drain regions, respectively.

According to another aspect of the present invention, a semiconductor device includes a substrate having including a plurality of first STIs arranged along a first direction and a plurality of second STIs arranged along a second direction, wherein the plurality of first STIs and the plurality of second STIs intersect and define a plurality of semiconductor islands. The semiconductor device further includes a plurality of transistors, each of the transistors disposed in a corresponding semiconductor island, wherein each of the transistors comprises a gate embedded in the semiconductor island and extending along a second direction. In addition, the semiconductor device includes a first source/drain regions disposed along the second direction and disposed with respect to a surface of the semiconductor island. Yet, the semiconductor device includes a first U-shaped channel region disposed between the first source/drain regions, and a second source/drain regions disposed along the second direction and disposed with respect to a surface of the semiconductor island. The semiconductor device further includes a second U-shaped channel region disposed between the second source/drain regions, and a plurality of source lines extending in a first direction intersecting with the first direction, each of the source lines coupling to a first source of the first source/drain region and a second source of the second source/drain regions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
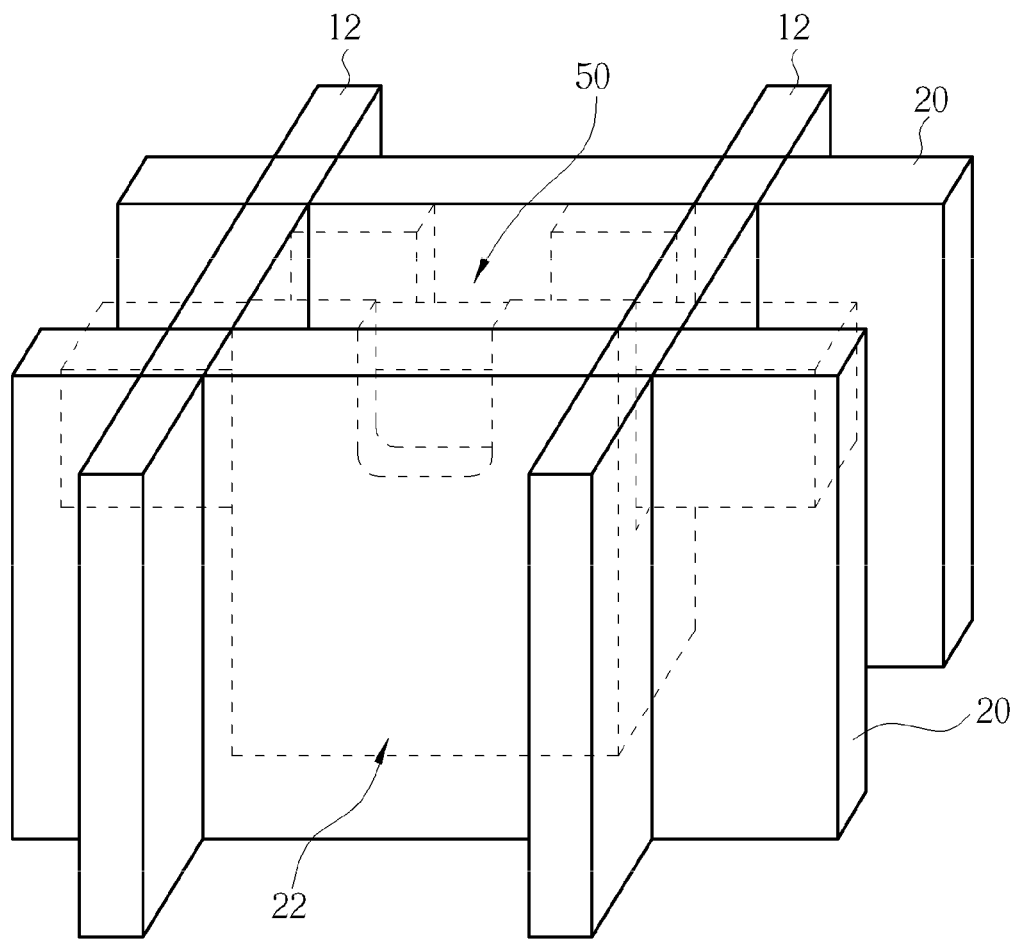
FIGS. 1-2 illustrate a three-dimensional graph of a single-gate dual-channel transistor according to a preferred embodiment of the present invention.
Figure 2:
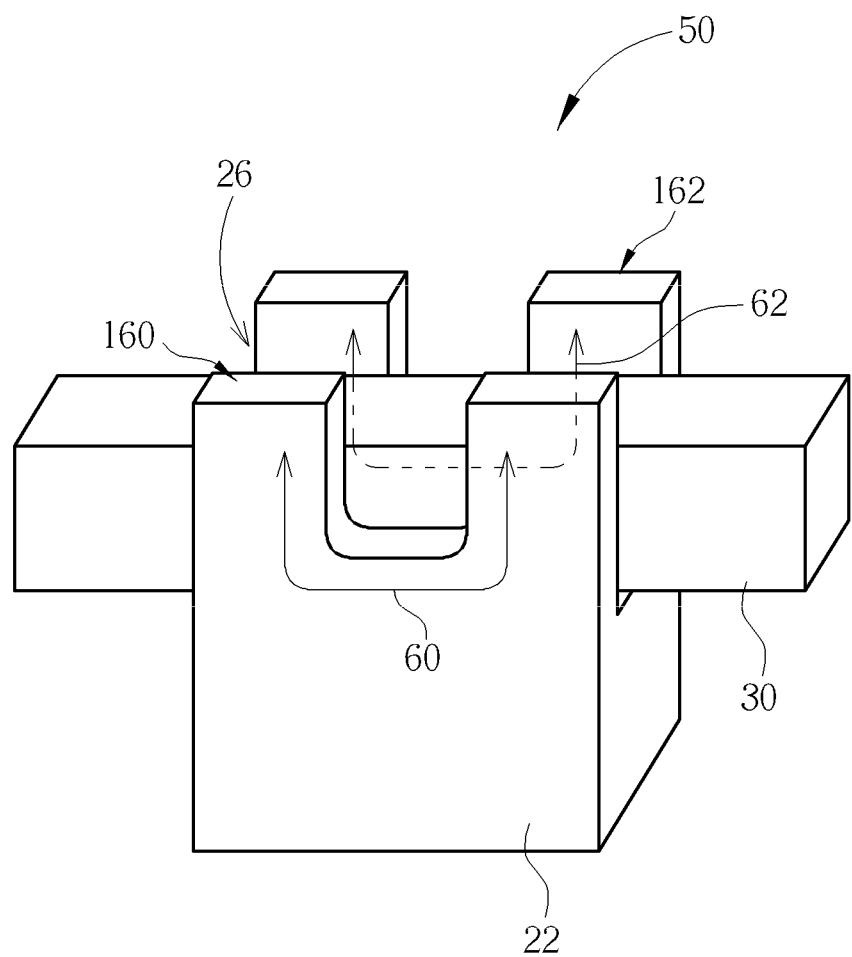

FIG. 1 to FIG. 2 illustrate a perspective, three-dimensional graph of a single-gate dual-channel transistor according to a preferred embodiment of the present invention. As shown in FIG. 1, a semiconductor island 22 (indicated by dotted line in FIG. 1) is isolated by a first STI 12 (indicated by solid line in FIG. 1) extending along a first direction and a second STI 20 (indicated by solid line in FIG. 1) extending along a second direction that is perpendicular to the first direction. A dual channel transistor 50 is fabricated in the semiconductor island 22. FIG. 2 shows the detailed structure of the dual channel transistor 50 in FIG. 1 by omitting the surrounding STI. As shown in FIG. 2, a gate trench 26 is recessed into the semiconductor island 22 and extends along the second direction between two U-shaped channel regions. A metal gate 30 is located at the bottom of the gate trench 26 and extends along the second direction. The top portion of the semiconductor island 22 is separated into a first U-shaped fin structure 160 and a second U-shaped fin structure 162. The first U-shaped fin structure 160 includes a first U-shaped channel region 60 disposed inside and the second U-shaped fin structure 162 includes a second U-shaped channel 62 disposed inside, wherein the second U-shaped channel region 62 is separated from the first U-shaped channel region 60 by the metal gate 30. Both of first U-shaped fin structure 160 and the second U-shaped fin structure 162 are in a shape of tuning fork and are symmetric to each other with respect to the metal gate 30. It is to be understood that a dielectric layer, source/drain regions, and other contact elements are omitted in FIG. 1 or FIG. 2 for the sake of clarity, and these omitted insulation or diffusion elements will be described in detail afterwards.

FIGS. 3 to 10 depict schematically a method of fabricating a single-gate dual-channel transistor according to a preferred embodiment of the present invention. For the sake of simplicity, only one cell unit is shown through FIGS. 3-10.

Figure 3:
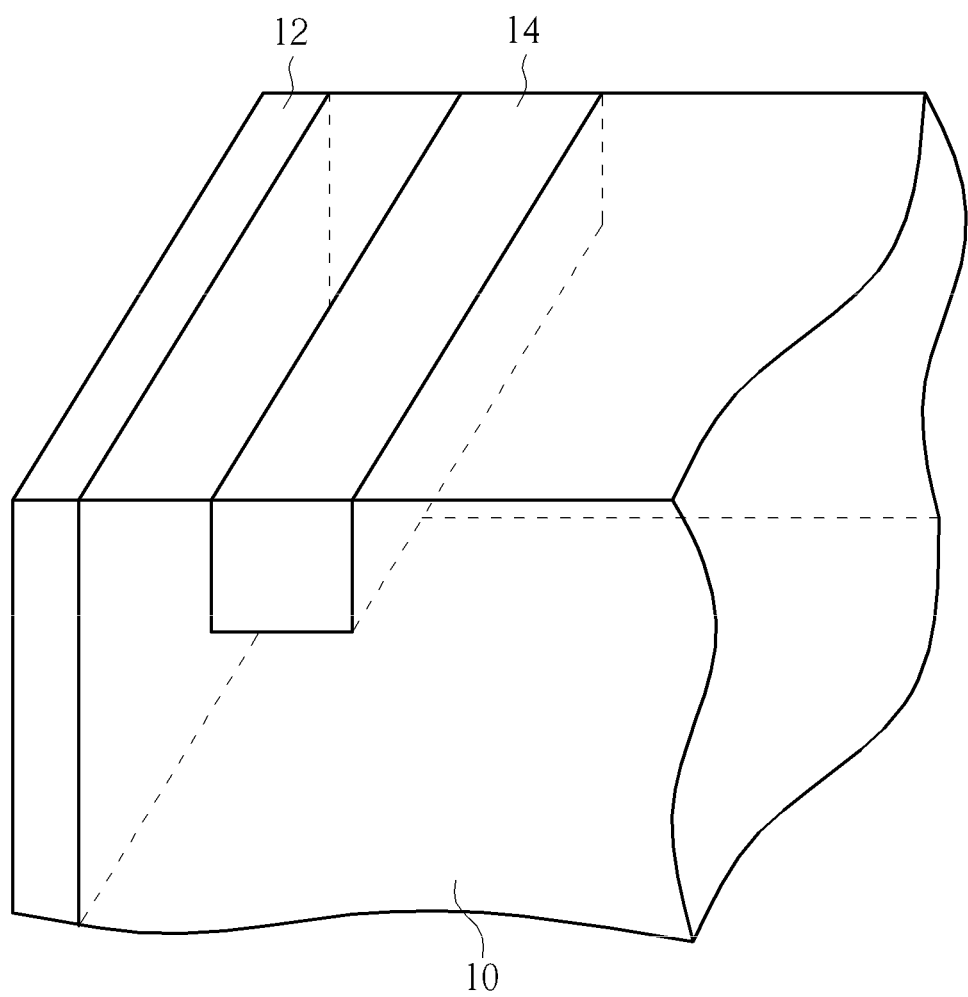
FIGS. 3-10 depict schematically a method of fabricating a single-gate dual-channel transistor according to a preferred embodiment of the present invention.

As shown in FIG. 3, a substrate 10 is provided. Next, a first STI 12 is formed in the first direction in the substrate 10. Although only one first STI is shown in FIG. 3, however, it is understood that actually a plurality of the first STI 12 may be formed in the substrate 10 in a duplicative line pattern. For the sake of simplicity, only one first STI 12 is shown. An embedded line shaped dielectric layer 14 that is parallel to the first STI 12 is then formed in the substrate 10. The dielectric layer 14 is formed between two of the first STI 12.

Figure 4:
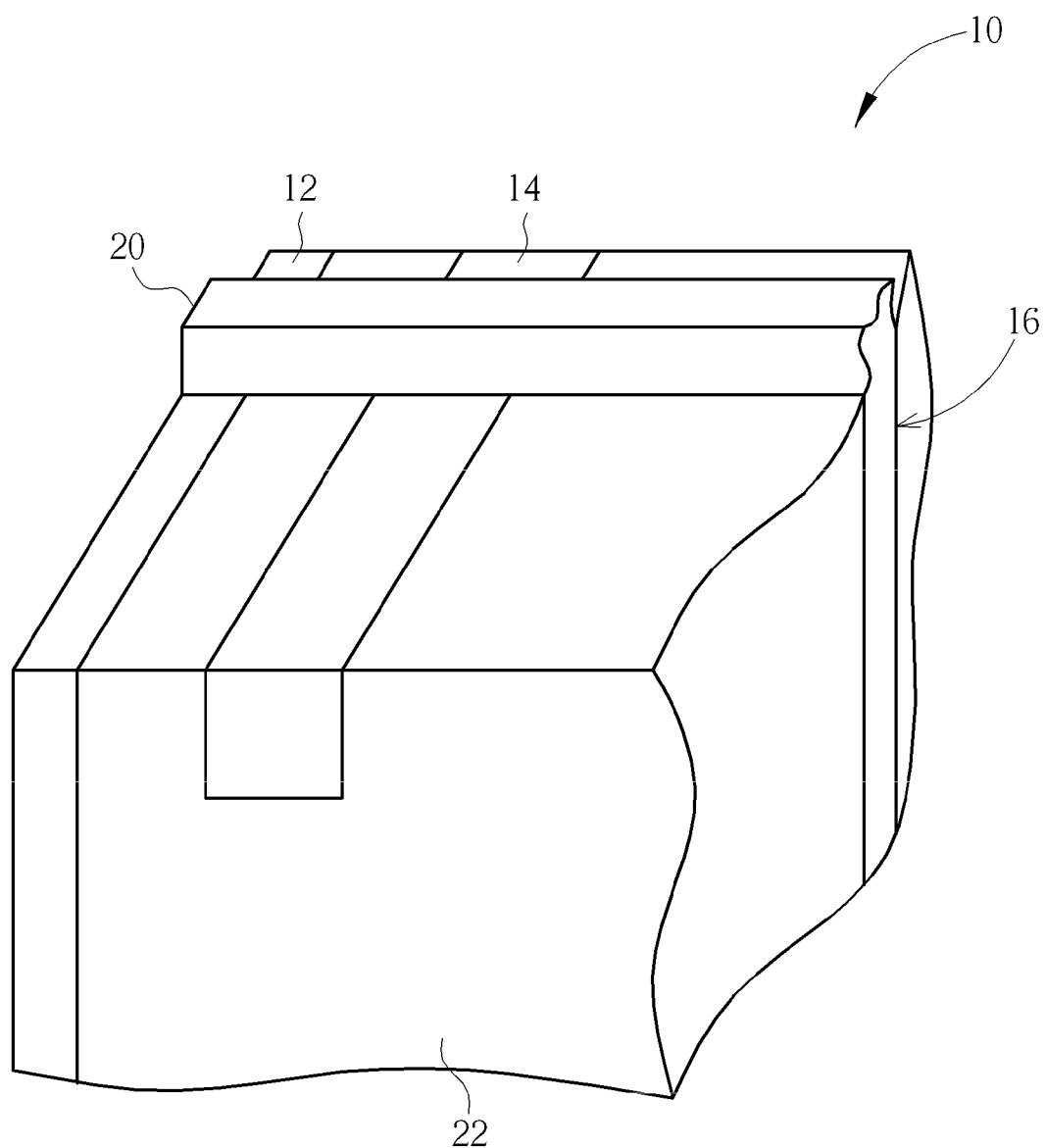

As shown in FIG. 4, a patterned mask (not shown) is formed on the substrate 10. Later, the substrate 10 is etched to form a STI trench 16. Later, a dielectric layer fills into the STI trench 16. Next, the patterned mask is removed to form a second STI 20. At this point, a semiconductor island 22 of the substrate 10 is defined and surrounded by the first STI 12 and the second STI 20. Referring back to FIG. 1, the relative location of the semiconductor island 22, the first STI 12, and second STI 20 are more clearly shown. Although only one second STI is shown in FIG. 4, however, it is understood that actually a plurality of the second STI 20 may be formed in the substrate 10. Furthermore, it is noteworthy that the top surface of the second STI 20 is higher than the top surface of the semiconductor island 22.

Figure 5:
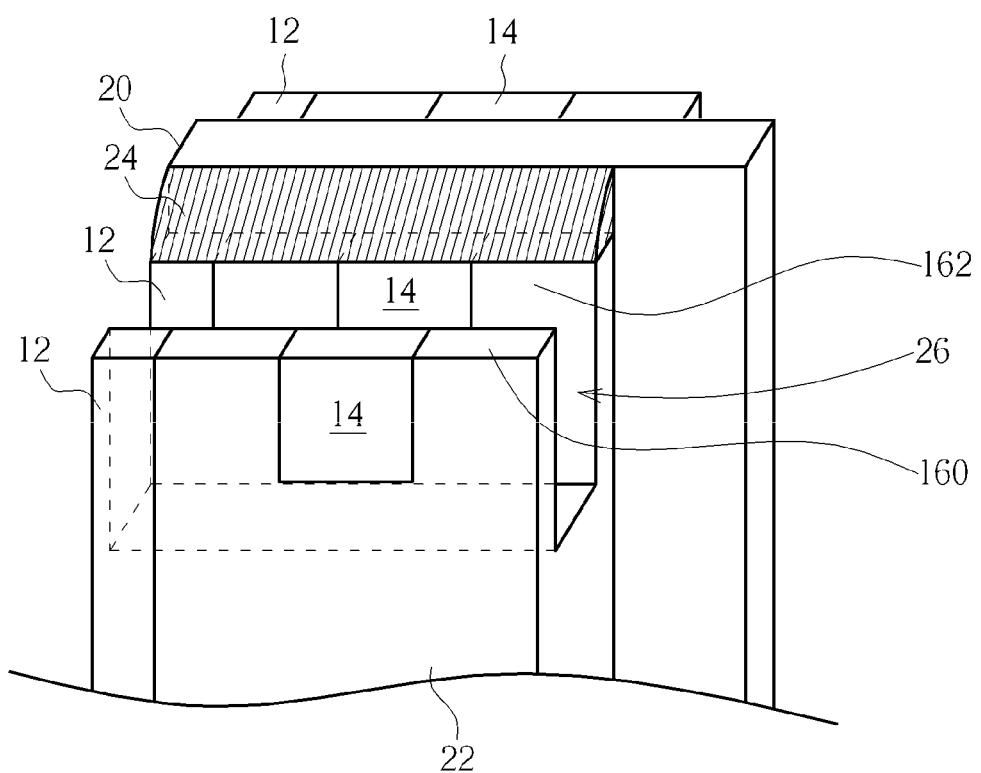

As shown in FIG. 5, a spacer 24 is formed on each sidewall of the second STI 20 above a top surface of the semiconductor island 22. Subsequently, a self-aligned etching process is performed to etch a line-shaped gate trench 26 into the semiconductor island 22 along the second direction by using the spacer 24 as an etching mask. The gate trench 26 in the second direction intersects the dielectric layer 14 in the first direction. The bottom of the gate trench 26 is deeper than the bottom of the dielectric layer 14. The top portion of the semiconductor island 22 is separated into a first U-shaped fin structure 160 and a second U-shaped fin structure 162 by the gate trench 26.

Figure 6:
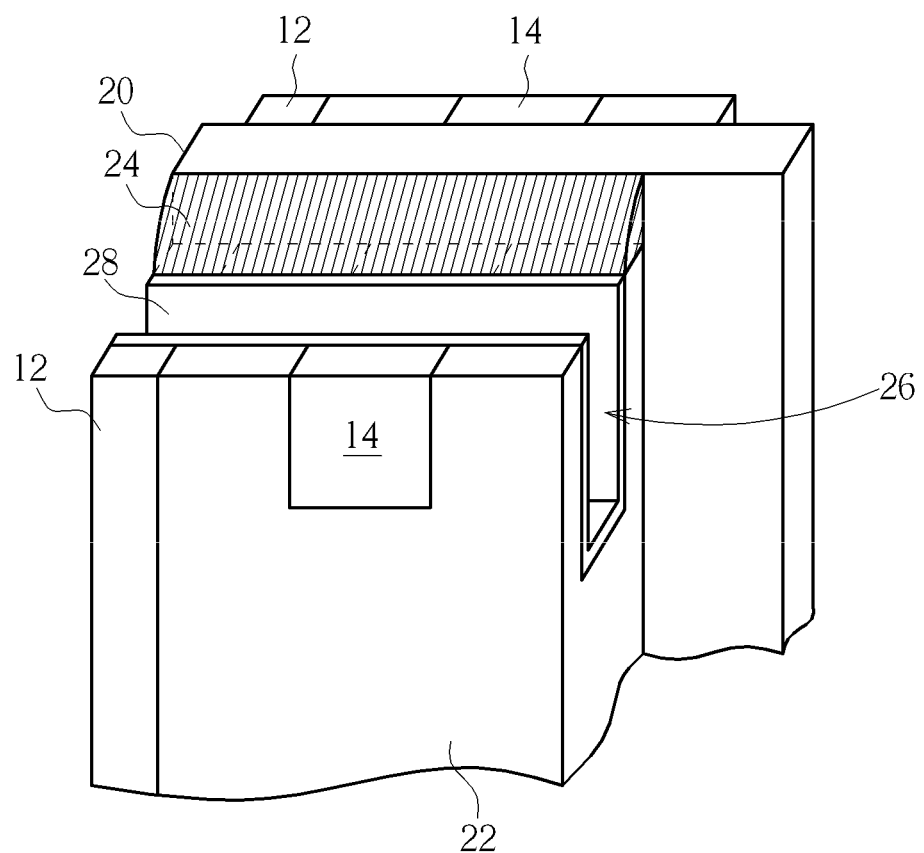

As shown in FIG. 6, a dielectric layer 28 is conformally formed on the sidewall and bottom of the gate trench 26. According to the embodiment of this invention, the dielectric layer 28 may be silicon oxide, silicon nitride, silicon oxynitride or oxide-nitride-oxide (ONO), but is not limited thereto. The dielectric layer 28 may be formed by conventional methods such as thermal oxidation or chemical vapor deposition methods. According to the embodiment of this invention, the dielectric layer 28 acts as a gate dielectric layer.

Figure 7:
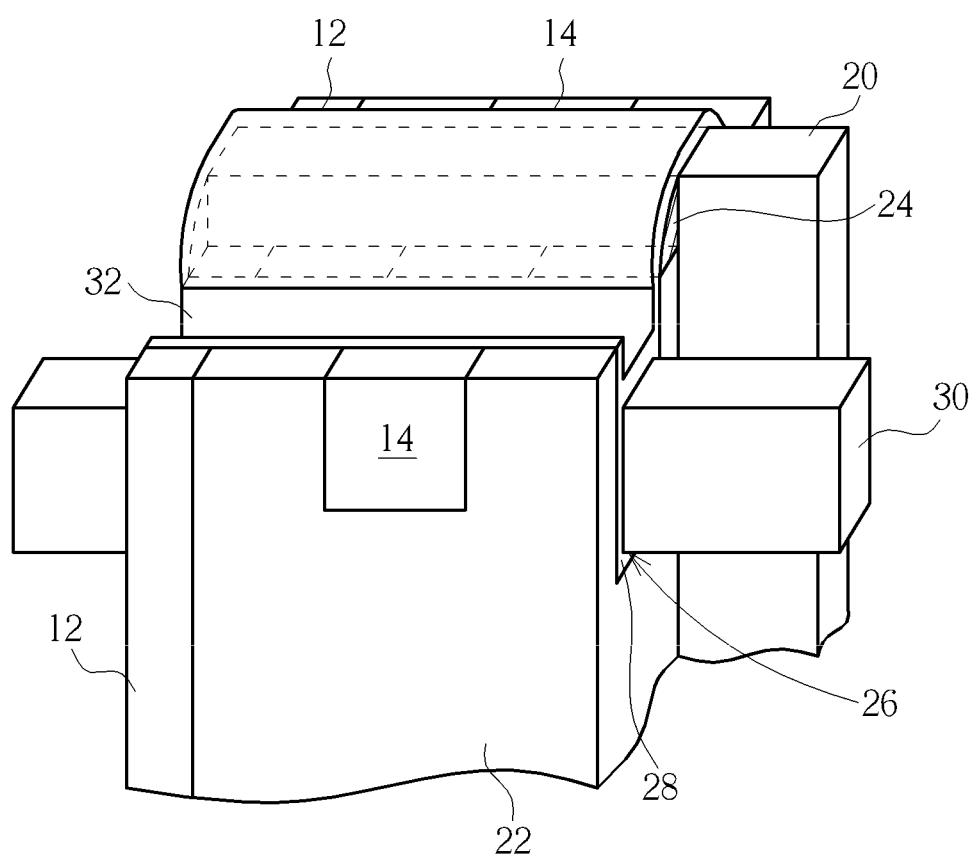

As shown in FIG. 7, a metal gate 30 is formed along the second direction at the bottom of the gate trench 26. Subsequently, the dielectric layer 28 above the metal gate 30 is removed. Then, a dielectric layer 32 is deposited on the metal gate 30, the sidewall of the gate trench 26, the spacer 24, and the exposed second STI 20.

Figure 8:
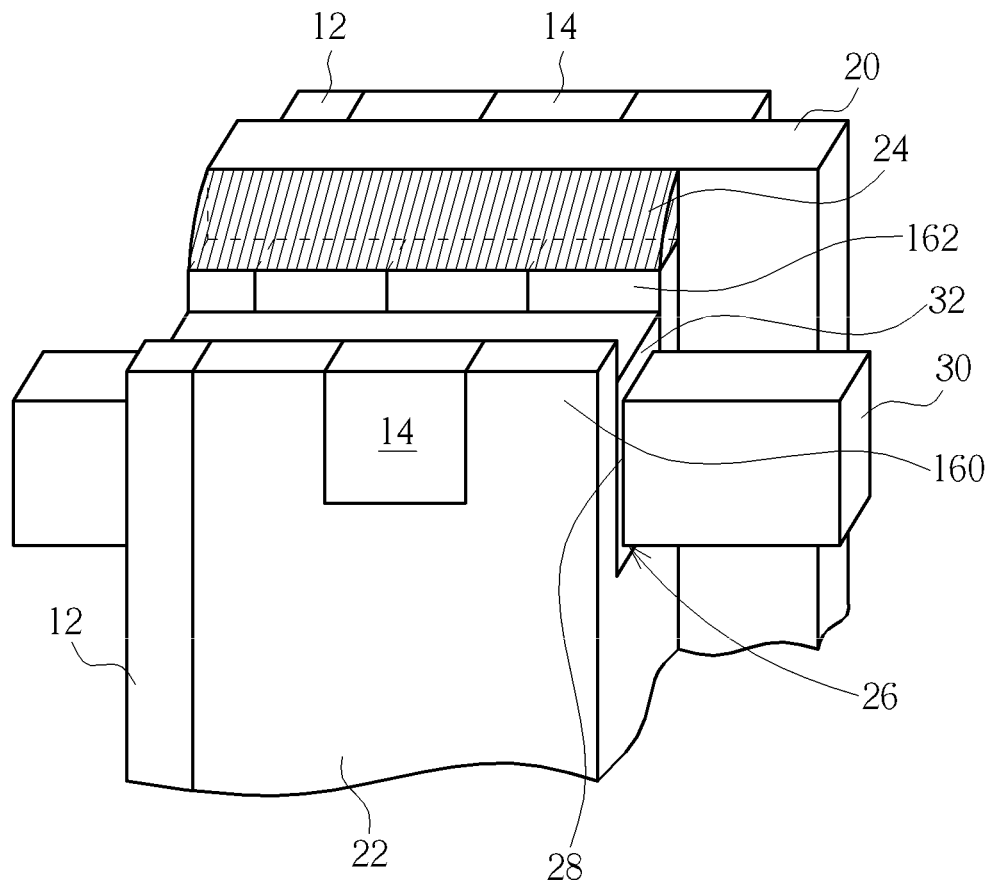

As shown in FIG. 8, an etching back process is performed to remove the dielectric layer 32 on the spacer 24, on the second STI 20 and part of the dielectric layer 32 on the metal gate 30 to form a trench top oxide (TTO) structure atop the metal gate 30 and expose a portion of the semiconductor island 22. At this point, the metal gate 30 is encapsulated by the dielectric layers 28 and 32.

Figure 9:
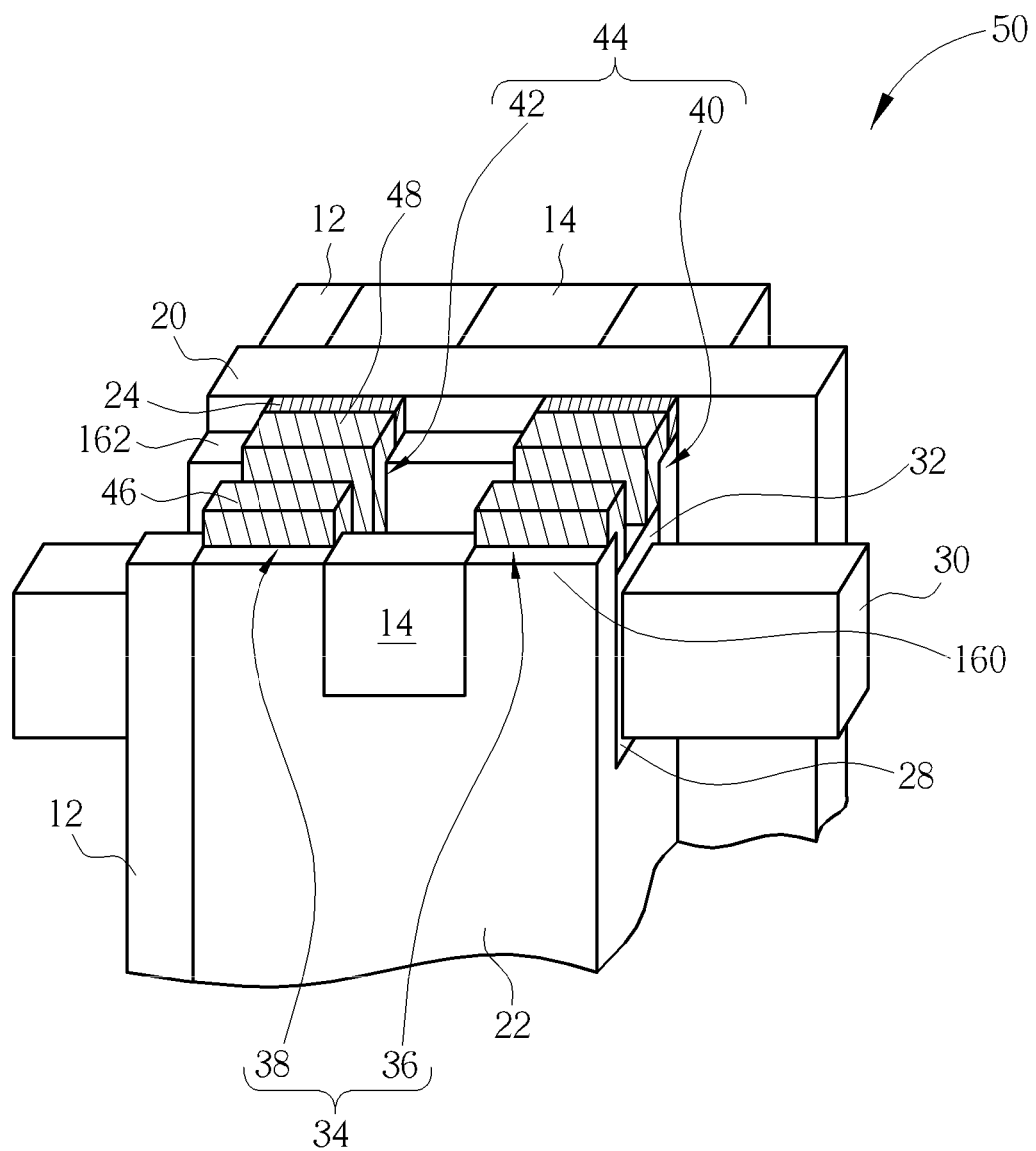

As shown in FIG. 9, first source/drain regions 34 of one U-shaped channel region are formed on the first U-shaped fin structure 160 and second source/drain regions 44 of the other U-shaped channel region are formed on the second U-shaped fin structure 162 simultaneously. The first source/drain regions 34 and the second source/drain regions 44 are at opposite sides of the metal gate 30. The dielectric layer 14 is disposed between the first source/drain regions 34 and between the second source/drain regions 44, respectively. The first source/drain regions 34 and the second source/drain regions 44 may be formed by conventional ion implantation methods or any other suitable methods known in the art. The first source/drain regions 34 include a first source 36 and a first drain 38. The second source/drain regions 44 include a second source 40 and a second drain 42.

Subsequently, a first conductive layer 46 such as an epitaxial layer can be optionally formed on the first source/drain regions 34 and a second conductive layer 48 such as an epitaxial layer can be optionally formed on the second source/drain regions 44. More specifically, the first conductive layer 46 is grown on the sidewall of the gate trench 26 and on the top surface of the semiconductor island 22, and the second conductive layer 48 is grown on the other sidewall of the gate trench 26 and on the top surface of the semiconductor island 22. The spacer 24 and a portion of the second STI 20 that is higher than the top surface of the first and second conductive layers 46 and 48 are then removed, for example, by chemical mechanical polishing (CMP) or any other suitable methods known in the art. At this point, the single-gate dual-channel transistor 50 of the present invention according to a preferred embodiment is completed.

Figure 10:
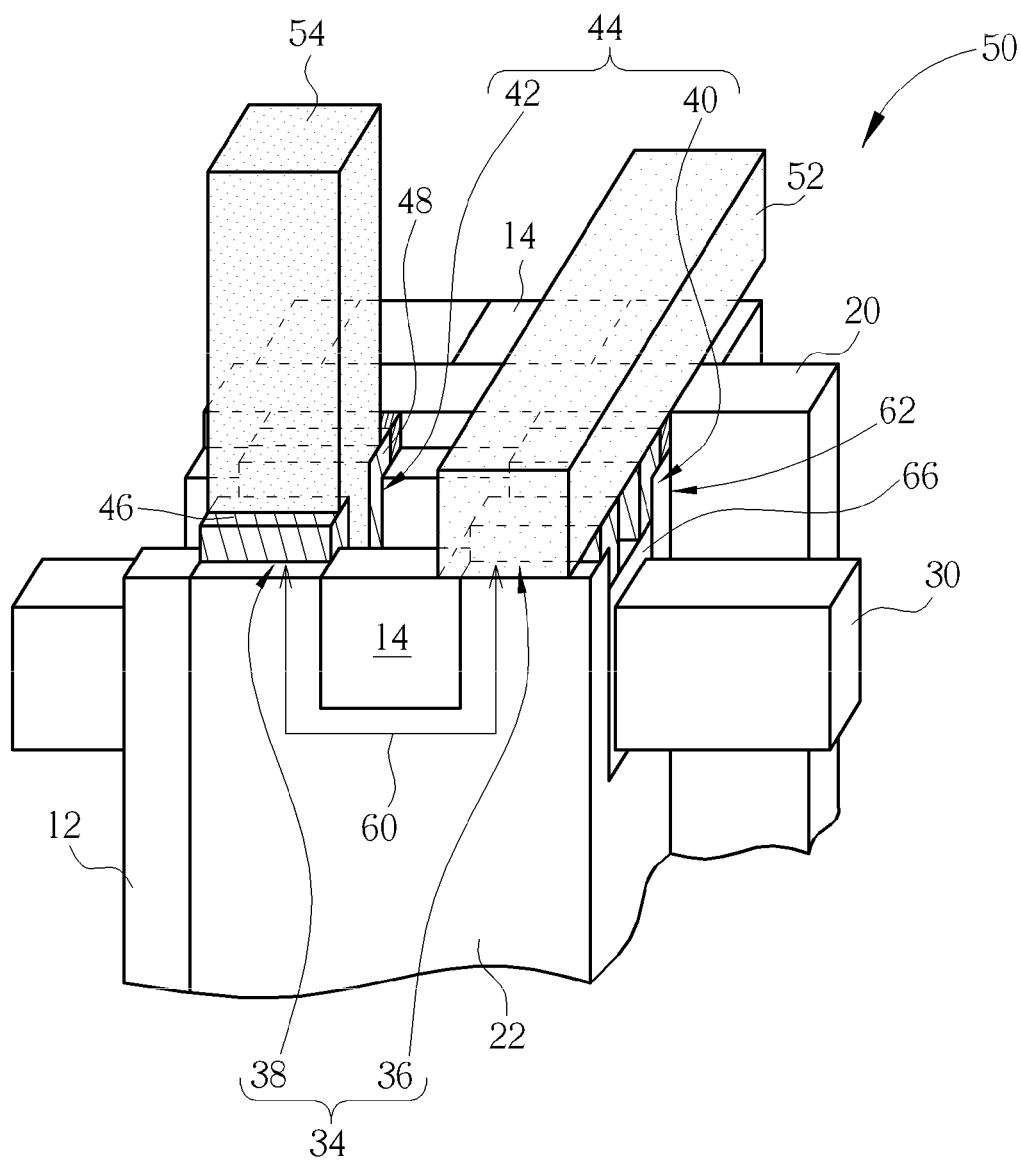

As shown in FIG. 10, subsequently, a first inter-layer dielectric layer (not shown) may be formed on the single-gate dual-channel transistor 50. A source line 52 is then formed in the first inter-layer dielectric layer to couple the first source 36 of the first source/drain regions 34 to the second source 40 of the second source/drain regions 44. Thereafter, a second inter-layer dielectric layer (not shown) may be formed on the first inter-layer dielectric layer. A drain contact 54 is then formed in the first and the second inter-layer dielectric layers to connect the first drain 38 of the first source/drain regions 34 and the second drain 42 of the second source/drain regions 44 concurrently. The lower end of the drain contact 54 is connected to both of the first drain 38 and the second drain 42. The upper end of the drain contact 54 can be connected to a capacitor (not shown) to form a cross-point memory cell or cross-hair cell (CHC) configuration. The optional first conductive layer 46 and the second conductive layer 48 provide larger process window during the fabrication of the drain contact.

Figure 11:
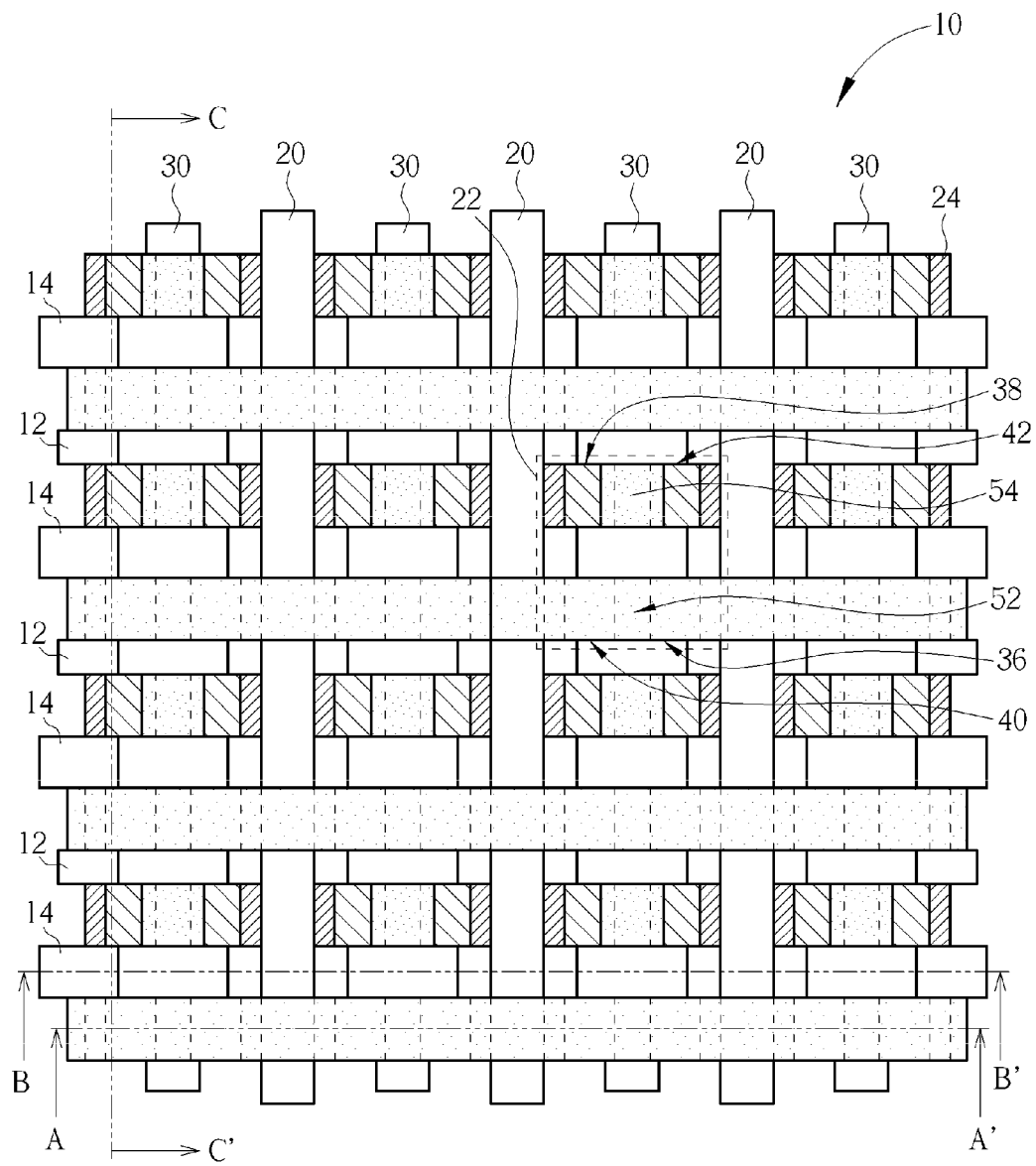
FIG. 11 shows a simplified layout of single-gate dual channel transistors.
Figure 12:
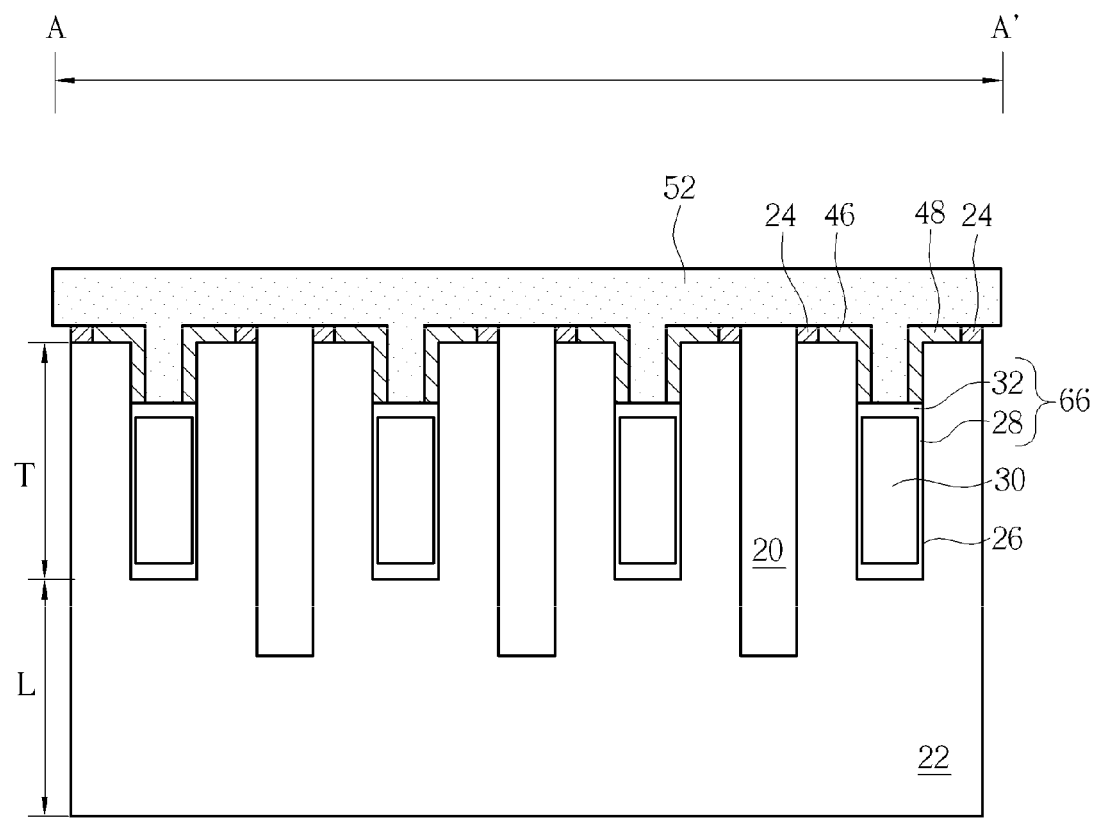
FIG. 12 shows a simplified sectional view of FIG. 11 taken along line AA'.
Figure 13:
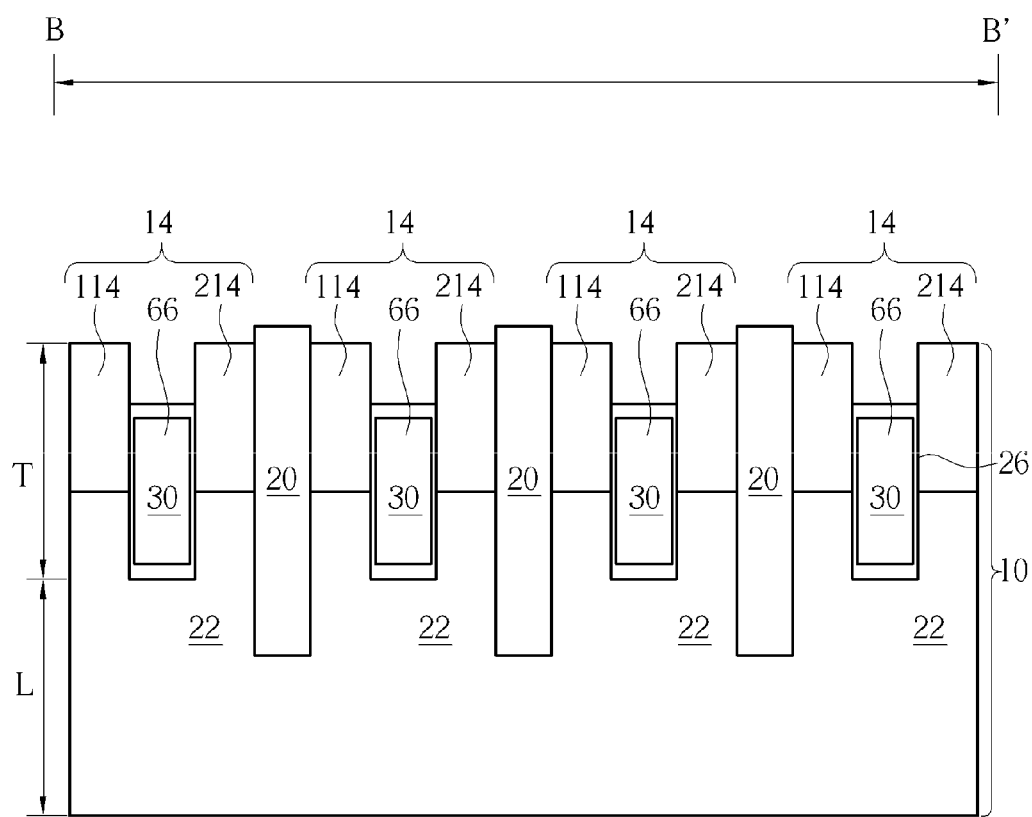
FIG. 13 shows a simplified sectional view of FIG. 11 taken along line BB'.
Figure 14:
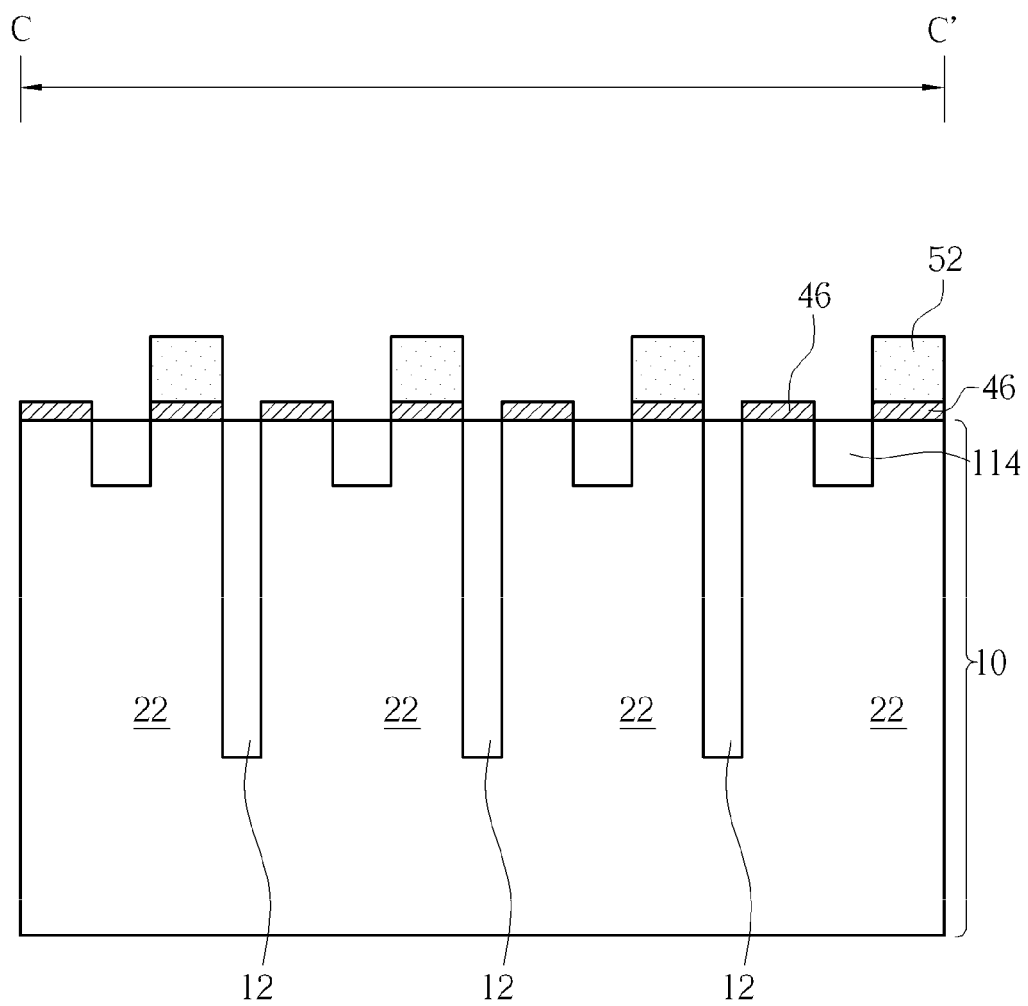
FIG. 14 shows a simplified sectional view of FIG. 11 taken along line CC'.

FIG. 11 shows an exemplary layout of the array of single-gate dual-channel transistors according to this invention. FIG. 12 shows a sectional view of FIG. 11 taken along line AA'. FIG. 13 shows a sectional view of FIG. 11 taken along line BB'. FIG. 14 shows a sectional view of FIG. 11 taken along line CC'.

As shown in FIG. 11, a plurality of single-gate dual-channel transistors 50 are arranged on the substrate 10 in an array. A plurality of the first STIs 12 and the second STIs 20 intersect with one another to thereby define a plurality of the semiconductor island 22 as set forth above. A plurality of source lines extend in a direction parallel to the first STIs.

As shown in FIGS. 10 and 11-14, the single-gate dual-channel transistor 50 includes a semiconductor island 22 isolated by the first STI 12 extending along the first direction and the second STI 20 extending along the second direction, wherein the first direction perpendicular to the second direction. A gate trench 26 extends along the second direction and is recessed into the semiconductor island 22. A metal gate 30 extends along the second direction and is embedded in the gate trench 26. The dielectric layer 66 encapsulates the metal gate 30 in the gate trench 26. The top surface of the dielectric layer 66 is lower than the top surface of the semiconductor island 22. The first source/drain regions 34 are disposed along the second direction and with respect to a top surface of the semiconductor island 22. More particularly, the first source/drain regions 34 can be doped regions disposed in the semiconductor island 22 or conductive epitaxial layers disposed on the surface of the semiconductor island 22. The dielectric layer 14 includes a dielectric layer 114 and a dielectric 214 disposed at opposite sides of the metal gate 30. The dielectric layer 114 is embedded in the semiconductor island 22 and is disposed between the first source/drain regions. The second source/drain regions 44 are disposed along the second direction and with respect to the top surface of the semiconductor island 22. More particularly, the second source/drain regions 44 can be doped regions disposed in the semiconductor island 22 or conductive epitaxial layers disposed on the surface of the semiconductor island 22. The dielectric layer 214 is embedded in the semiconductor island 22 and between the second source/drain regions 44. The first source/drain regions 34 and the second source/drain regions 44 are symmetric with respect to the metal gate 30. The first U-shaped channel region 60 is disposed around the dielectric layer 114 and between the first source/drain regions 34. The second U-shaped channel region 62 is disposed around the dielectric layer 214 and between the second source/drain regions 44. The location of the second U-shaped channel region 62 can be best seen in FIG. 1 and FIG. 2. The dielectric layers 114 and 214 elongate the current path between the first source/drain regions 34 and the second source/drain regions 44 respectively, and therefore the current paths form U-shaped. In this way, the short channel effect can be prevented.

The first U-shaped channel region 60 and the second U-shaped channel region 62 are symmetric with respect to the metal gate 30. Furthermore, the semiconductor island 22 includes a top portion T and a bottom portion L, so that the first U-shaped channel region 60 and the second U-shaped channel region 62 are disposed within the top portion T and the bottom portion L serves as an electric reservoir of the first U-shaped channel region 60 and the second U-shaped channel region 62.

Referring to FIG. 10, if the first source/drain regions 34 are disposed in the semiconductor island 22, the first conductive layer 46 can be disposed optionally on the first source/drain doping regions 34. The first conductive layer 46 may be an epitaxial layer formed on the sidewall of the gate trench 26 and on the top surface of the semiconductor island 22. If the second source/drain regions 44 are disposed in the semiconductor island 22, the second conductive layer 48 can be disposed optionally on the second source/drain doping regions 44. The second conductive layer 48 may be another epitaxial layer formed on the sidewall of the gate trench 26 and on the top surface of the semiconductor island 22. The source line 52 is disposed on the first source 36 in the first source/drain regions 34 and the second source 40 in the second source/drain regions 44. The drain contact 54 is formed to connect the first drain 38 in the first source/drain regions 34 and a second drain 42 in the second source/drain regions 44 simultaneously. One end of the drain contact 54 is connected to the first drain 38 and the second drain 42. The other end of the drain contact 54 can be connected to a capacitor (not shown). When there is a signal input from the source line 52 and metal gate 30, the first U-shaped channel region 60 and the second U-shaped channel region 62 are turned on simultaneously and send the signal into the capacitor through the drain contact 54.

Figure 15:
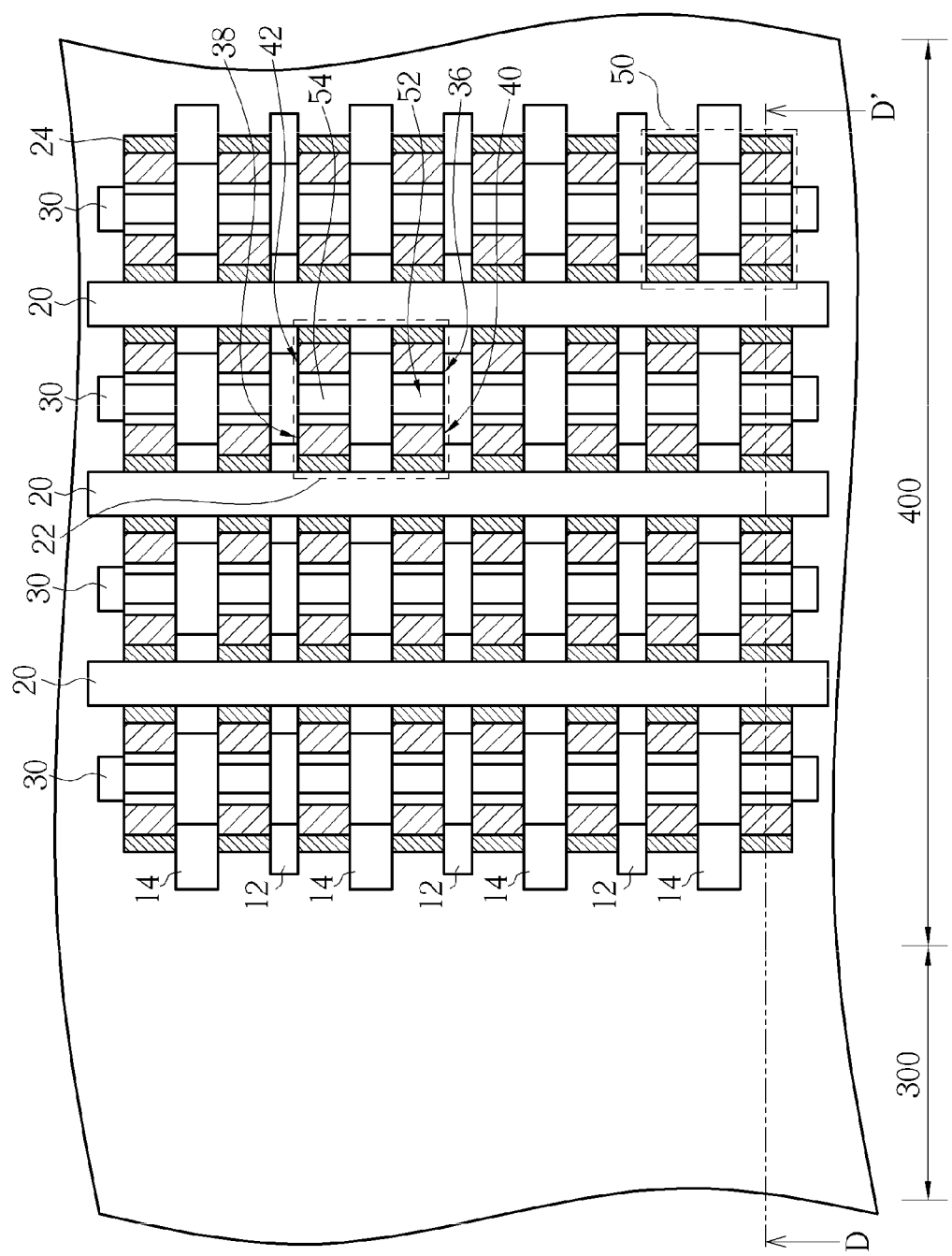
FIG. 15 to FIG. 22 are schematic, cross-sectional diagrams showing the steps of fabricating a source line and a peripheral gate according to another embodiment of the present invention.
Figure 16:
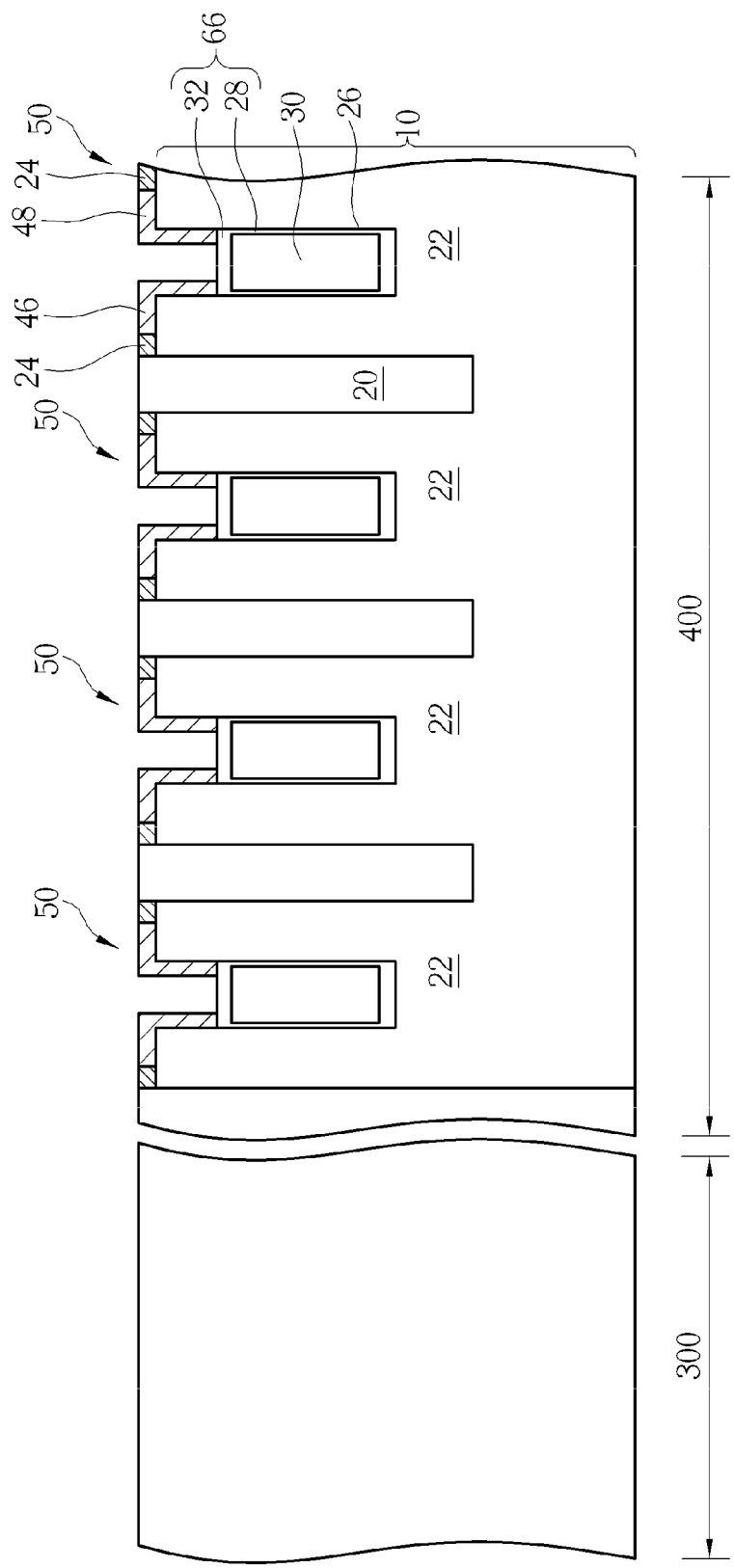

According to another preferred embodiment, the aforesaid source line 52 in the array region and a peripheral gate in a peripheral region can be formed simultaneously by using the same fabricating steps. FIG. 15 to FIG. 22 show the integration of the source line and a peripheral gate schematically, wherein like numerals designate like components or regions in the drawings. FIG. 15 shows an exemplary layout of a semiconductor device, the layout includes the array of single-gate dual-channel transistors 50 shown in FIG. 9 and a peripheral region. FIG. 16 shows a sectional view of FIG. 15 taken along line DD'. The features shown in FIG. 17 to FIG. 22 can be implemented after the single-gate dual-channel transistor 50 of FIG. 9 is completed.

Referring to FIG. 15 and FIG. 16, a peripheral region 300 and an array region 400 are defined on a substrate 10. Peripheral circuitry is formed within the peripheral region 300 and memory array is disposed within the array region 400.

A plurality of single-gate dual-channel transistors 50 having a structure identical to that of FIG. 9 are arranged in rows and columns in the array region 400. A plurality of first STIs 12 and the second STIs 20 are provided in the substrate 10, and the first STIs 12 and the second STIs 20 intersect with one another to thereby define a plurality of semiconductor islands 22. Each of the single-gate dual-channel transistors 50 is fabricated in the corresponding semiconductor island 22. The structure and the fabrication steps of the single-gate dual-channel transistors 50 are similar with FIGS. 1-9 and are omitted for the sake of simplicity.

Figure 17:
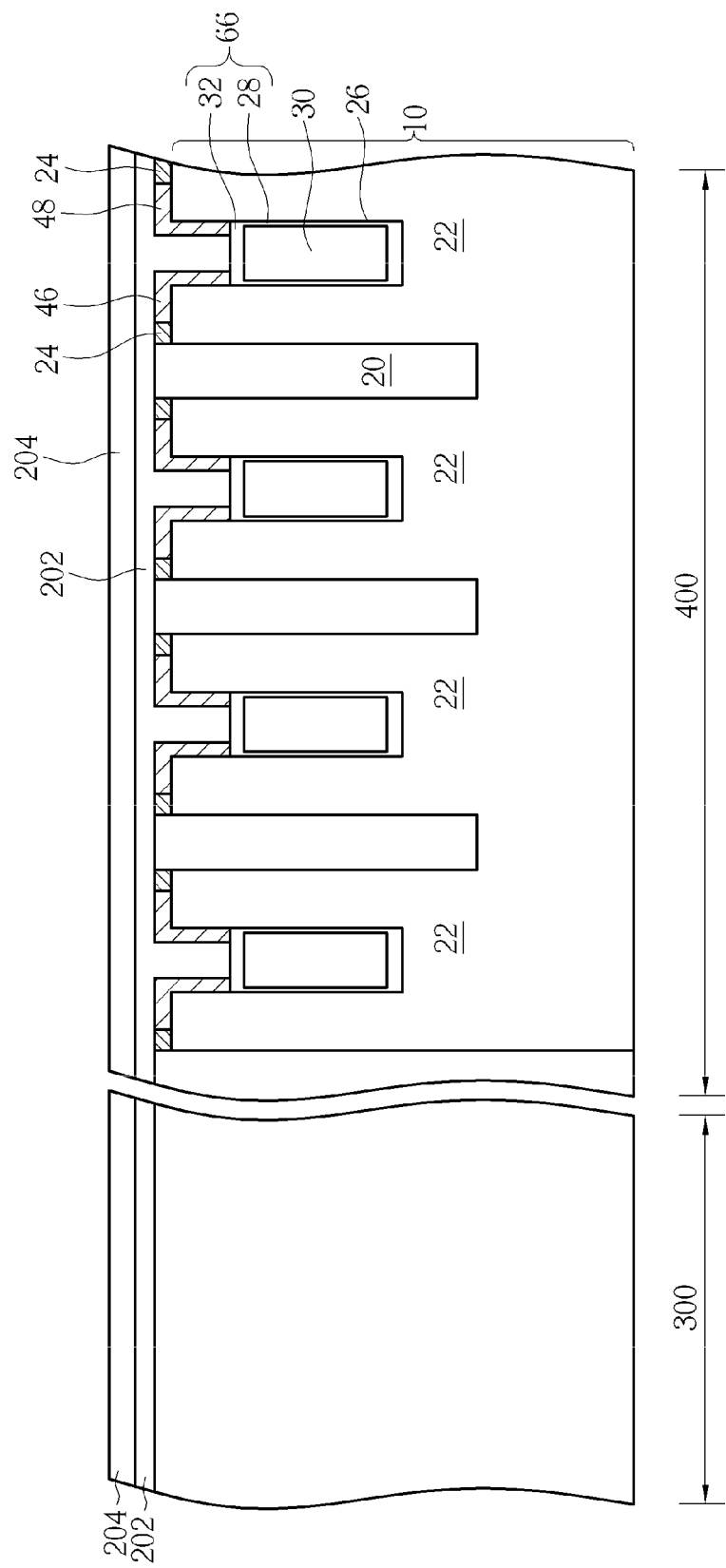

As shown in FIG. 17, a gate dielectric layer 202 is formed on the peripheral region 300 and the array region 400. The gate dielectric layer 202 may covers the spacers 24 and the first conductive layer 46. A conductive layer 204 is then formed on the gate dielectric layer 202 within the peripheral region 300 and the array region 400. The conductive layer 204 may be a doped polysilicon layer.

Figure 18:
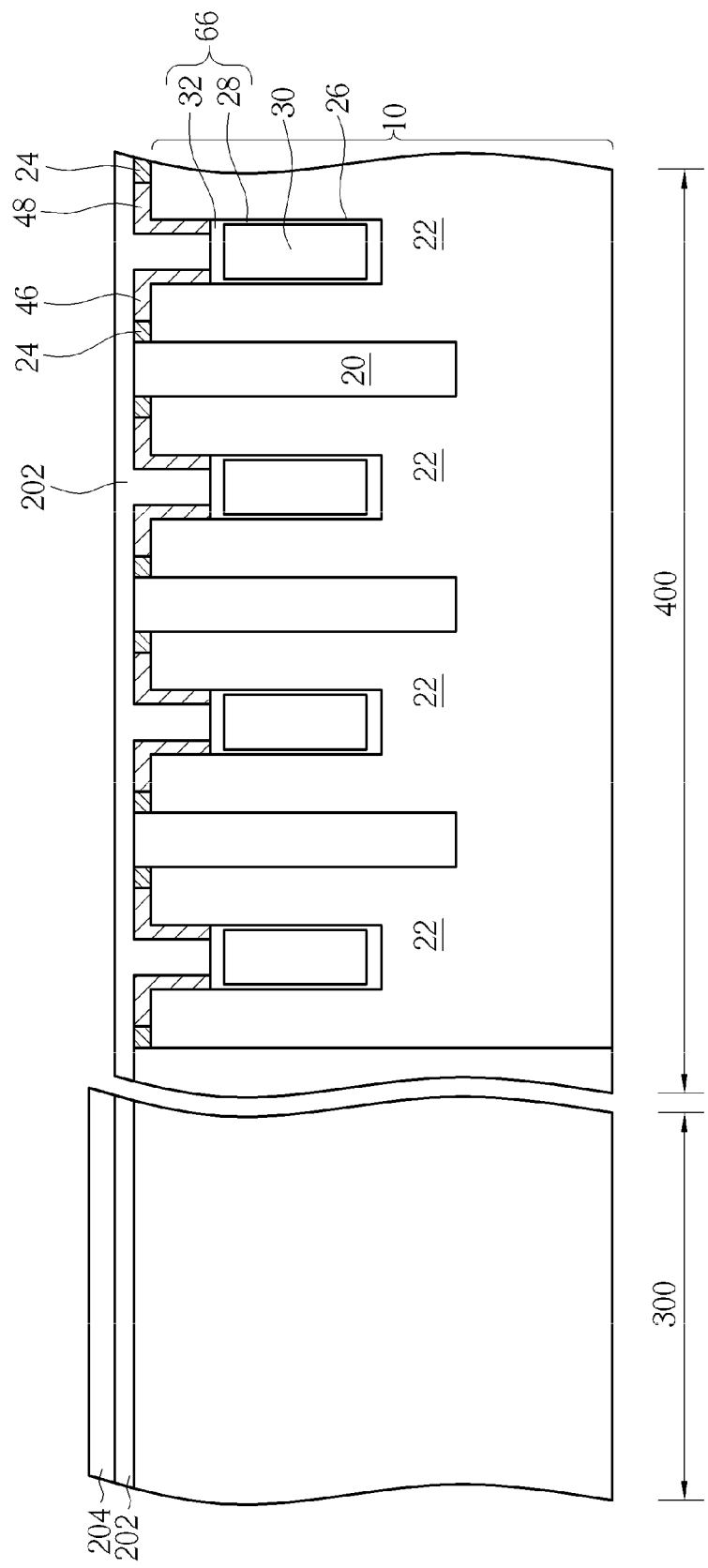

As illustrated in FIG. 18, the conductive layer 204 within the array region 400 is removed. To remove the conductive layer 204 within the array region 400, for example, a photoresist pattern may be provided to mask the peripheral region 300 and to expose the array region 400. A dry etching process is then carried out to etch the exposed conductive layer 204 within the array region 400. Thereafter, the photoresist pattern is stripped to reveal the conductive layer 204 within the peripheral region 300.

Figure 19:
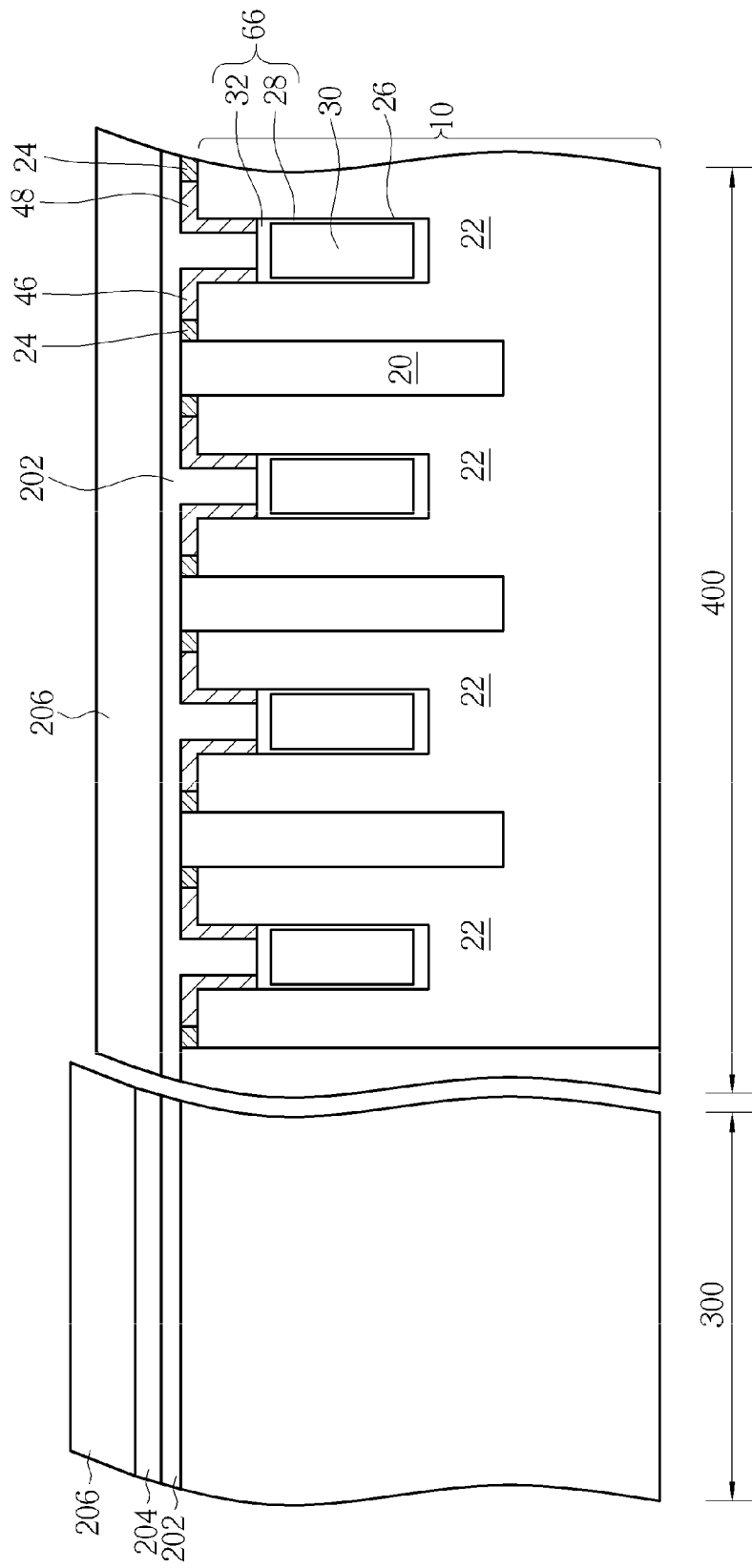

As shown in FIG. 19, an interlayer dielectric layer 206 such as silicon oxide is formed in a blanket manner on the conductive layer 204 within the peripheral region 300 and on the gate dielectric layer 202 within the array region 400. The interlayer dielectric layer 206 may be formed by conventional deposition or coating methods known in the art.

Figure 20:
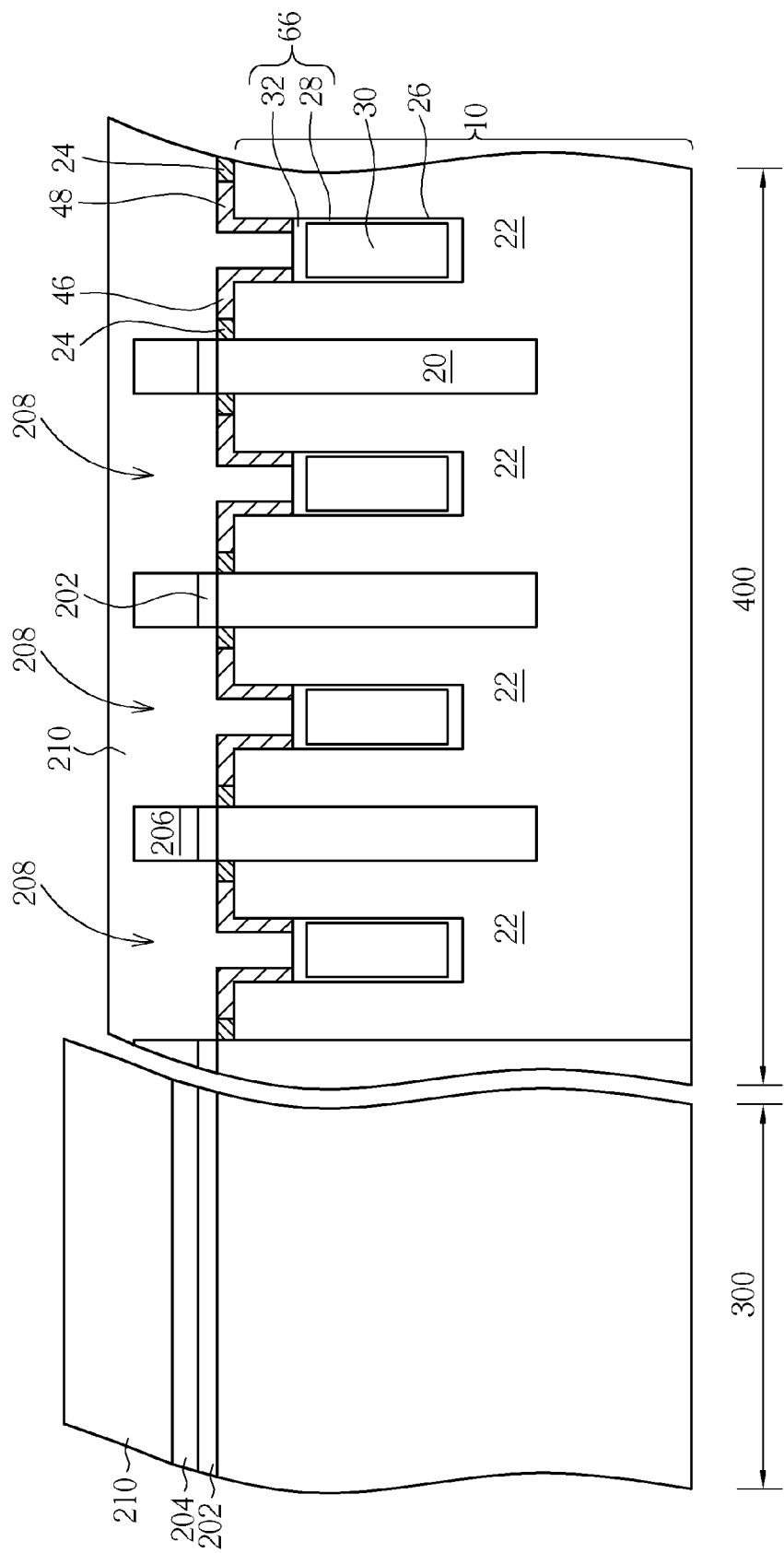

As shown in FIG. 20, subsequently, the interlayer dielectric layer 206 within the peripheral region 300 is removed. To remove the interlayer dielectric layer 206 within the peripheral region 300, for example, a photoresist pattern may be provided to mask the array region 400 and to expose the peripheral region 300. A dry etching process is then carried out to etch the exposed interlayer dielectric layer 206 within the peripheral region 300. Thereafter, the photoresist pattern is stripped to reveal the interlayer dielectric layer 206 within the array region 400. Next, a plurality of source line contact holes 208 are formed in the gate dielectric layer 202 and the interlayer dielectric layer 206 within the array region 400. The source line contact hole 208 exposes the spacers 24 and a portion of the first conductive layer 46.

Still referring to FIG. 20, a conductive layer 210 such as a doped polysilicon layer is formed within both the peripheral region 300 and the array region 400. The conductive layer 210 fills up the source line contact holes 208 and covers the interlayer dielectric layer 206 within the array region 400. Referring briefly back to FIG. 9, the conductive layer 210 is coupled to the first source 36 of the first source/drain region 34, and the second source 40 of the second source/drain region 44.

Figure 21:
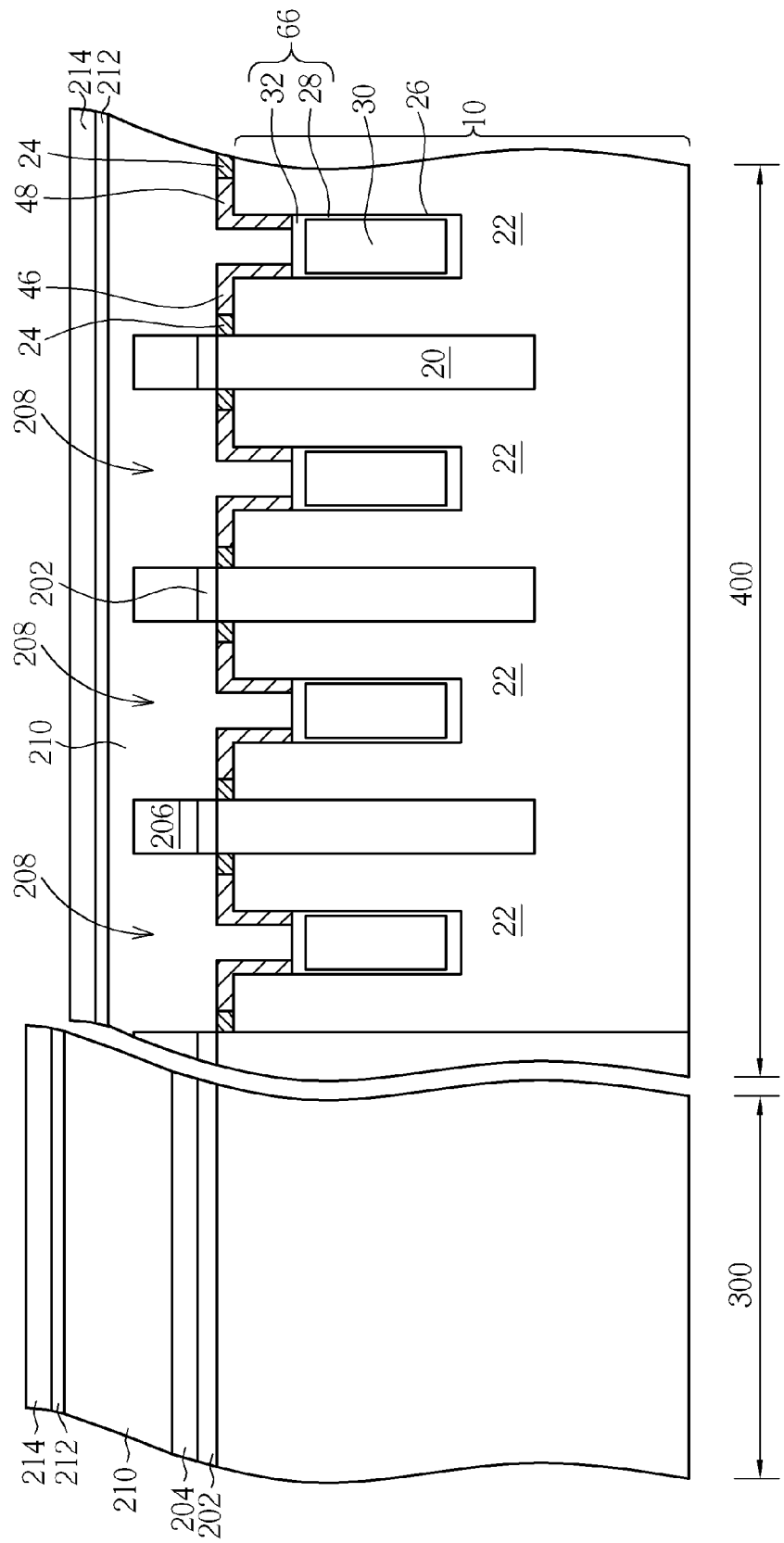
Figure 22:
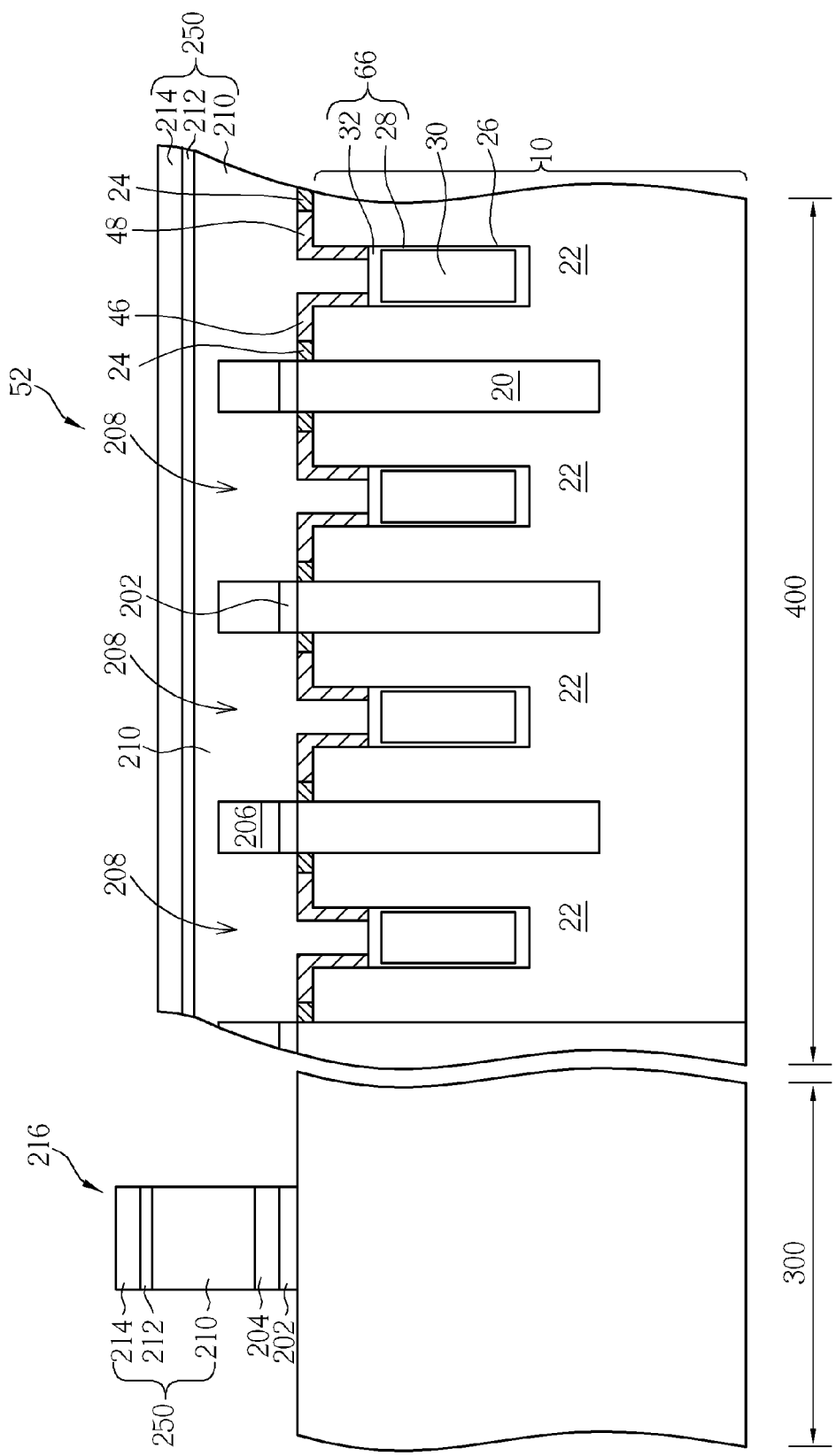

As shown in FIG. 21, a conductive layer 212 such as metal and a protective layer 214 such as silicon nitride are formed on the conductive layer 210 sequentially. As shown in FIG. 22, the stack layer 250 including at least the conductive layers 210, 212 and the protective layer 214 within the peripheral region 300 and the array region 400, and the conductive layer 204, the gate dielectric layer 202 in the peripheral region 300 are patterned simultaneously by using a single photo mask, thereby forming at least one peripheral gate 216 and a plurality of source lines 52 in the peripheral region 300 and array region 400 respectively. The source lines 52 are parallel to the first STI 12, and the locations of the source lines 52 of this embodiment is the same as the locations of the source lines 52 shown in FIG. 11. Please refer to FIG. 11 for the plan view of the source lines 52. As shown in FIG. 11, the source line 52 couples the first source 36 of the source/drain regions 34 and the second source 40 of the second source/drain regions 44.

From one aspect, the features of the present invention at least reside in that one metal gate controls two U-shaped channel regions. Furthermore, because the gate trench is formed by a self-aligned process, the thickness of the first and second U-shaped fin structure is minimized so that the metal gate in the gate trench will have adequate thickness. Moreover, the thin first and second U-shaped fin structure make the metal gate, the sidewall of the gate trench, and the dielectric layer form a thin body SOI transistor, which provides a better performance. Those skilled in the art will readily observe that numerous modifications and alterations of the device and method may be made while retaining the teachings of the invention. Specific examples of components and processes are described to help clarify the disclosure. These are, of course, merely examples and are not intended to limit the disclosure from that described in the claims. Although illustrative embodiments of this invention have been shown and described, other modifications, changes, and substitutions are intended. Accordingly, it is appropriate that the appended claims be construed broadly and in a manner consistent with the scope of the disclosure, as set forth in the following claims.

What is claimed is:

1. A semiconductor device having a dual channel transistor, comprising:
    a semiconductor island isolated by at least a first shallow trench isolation extending along a first direction and a second shallow trench isolation extending along a second direction, wherein the first shallow trench isolation intersects the second shallow trench isolation;
    a gate trench extending along the second direction and recessed into the semiconductor island;
    a gate extending along the second direction and disposed at the gate trench;
    a first dielectric layer encapsulating the gate in the gate trench;
    a first source/drain regions disposed along the second direction and disposed with respect to a top surface of the semiconductor island;
    a second dielectric layer whose bottom is higher than that of the gate trench, embedded in the semiconductor island and disposed between the first source/drain regions;
    a first U-shaped channel region disposed around the second dielectric layer and between the first source/drain regions;
    a second source/drain regions disposed along the second direction and disposed with respect to the top surface of the semiconductor island;
    a third dielectric layer embedded in the semiconductor island and between the second source/drain regions; and a second U-shaped channel region disposed around the third dielectric layer and between the second source/drain regions.

2. The semiconductor device of claim 1, wherein the first source/drain regions and the second source/regions are disposed at opposite sides of the semiconductor island.

3. The memory device of claim 1, wherein the first source/drain regions and the second source/regions are disposed at opposite sides of the gate.

4. The semiconductor device of claim 1, wherein the first source/drain regions are disposed in the semiconductor island.

5. The semiconductor device of claim 4, further comprising a first conductive layer disposed on the first source/drain regions.

6. The semiconductor device of claim 5, wherein the first conductive layer is also disposed in the gate trench and on the first dielectric layer.

7. The semiconductor device of claim 1, wherein the second source/drain regions are disposed in the semiconductor island.

8. The semiconductor device of claim 7, further comprising a second conductive layer disposed on the second source/drain regions.

9. The semiconductor device of claim 8, wherein the second conductive layer is also disposed in the gate trench and on the first dielectric layer.

10. The semiconductor device of claim 1, wherein the first source/drain regions and the second source/drain regions are symmetric with respect to the gate.

11. The semiconductor device of claim 1, further comprising a source line coupling a first source in the first source/drain regions to a second source of the second source/drain regions.

12. The semiconductor device of claim 1, further comprising a drain contact coupling a first drain in the first source/drain regions to a second drain in the second source/drain regions.

13. The semiconductor device of claim 1, wherein a top surface of the first dielectric layer is lower than the top surface of the semiconductor island.

14. The semiconductor device of claim 1, wherein the semiconductor island comprises a top portion and a bottom portion, such that the first U-shaped channel region and the second U-shaped channel region are disposed within the top portion and the bottom portion serves as an electric reservoir of the first U-shaped channel region and the second U-shaped channel region.

15. The semiconductor device of claim 1, further comprising a periphery circuitry comprising at least a periphery gate comprising at least one layer.

16. The semiconductor device of claim 15, further comprising a source line coupling a first source in the first source/drain regions to a second source of the second source/drain regions, wherein the source line comprises at least one layer that is substantially identical to the peripheral gate.

17. The semiconductor device of claim 1, further comprising a spacer disposed on the semiconductor island and the spacer does not contact the gate.

18. A semiconductor device, comprising:
a semiconductor island isolated by a first shallow trench isolation extending along a first direction and a second shallow trench isolation extending along a second direction, wherein the first shallow trench isolation intersects the second shallow trench isolation;
a gate trench recessed into the semiconductor island and extending along the second direction;
a gate whose top surface is lower than that of the semiconductor island and embedded in the gate trench;
a first U-shaped channel region in the semiconductor island; and
a second U-shaped channel region in the semiconductor island, wherein the second U-shaped channel region is separated from the first U-shaped channel region by the gate.

19. The semiconductor device of claim 18, further comprising a spacer disposed on the semiconductor island and the spacer does not contact the gate.

20. A semiconductor device, comprising:
a substrate including a plurality of first shallow trench isolations arranged along a first direction and a plurality of second shallow trench isolations arranged along a second direction, wherein the plurality of first shallow trench isolations and the plurality of second shallow trench isolations intersect and define a plurality of semiconductor islands;
a plurality of transistors, each of the transistor disposed in a corresponding semiconductor island, wherein each of the transistor comprises: a gate embedded in the semiconductor island and extending along a second direction; a first source/drain regions comprising a first source and a first drain and disposed along the second direction and disposed with respect to a top surface of the semiconductor island; a first U-shaped channel region disposed between the first source/drain regions; a second source/drain regions disposed along the second direction and disposed with respect to the top surface of the semiconductor island; a second U-shaped channel region disposed between the second source/drain regions; and
a plurality of source lines extending in the first direction intersecting the second direction, each of the source lines being coupled to a first source of the first source/drain region and a second source of the second source/drain regions.

21. The semiconductor device of claim 20, further comprising: a peripheral circuitry disposed at a periphery region of the substrate, wherein the peripheral circuitry comprising at least a periphery gate comprising at least one layer.

22. The semiconductor device of claim 21, wherein the source line comprises at least one layer that is substantially identical to the peripheral gate.

23. The semiconductor device of claim 20, wherein each of the transistors further comprises a spacer disposed on the semiconductor island and the spacer does not contact the gate.

* * * * *